United States Patent
Lopatinsky et al.

(10) Patent No.: US 6,659,169 B1
(45) Date of Patent: Dec. 9, 2003

(54) COOLER FOR ELECTRONIC DEVICES

(75) Inventors: Edward Lopatinsky, San Diego, CA (US); Lev A. Fedoseyev, Chula Vista, CA (US); Yuriy Igorevich Fedosov, Sankt-Petersburg (RU); Nil Askhatov, El Cajon, CA (US)

(73) Assignee: Advanced Rotary Systems, LLC, San Diego, CA (US)

( * ) Notice: Subject to any disclaimer, the term of this patent is extended or adjusted under 35 U.S.C. 154(b) by 0 days.

(21) Appl. No.: 09/890,776

(22) PCT Filed: Dec. 7, 2000

(86) PCT No.: PCT/US00/33145

§ 371 (c)(1),
(2), (4) Date: Aug. 6, 2001

(87) PCT Pub. No.: WO01/43519

PCT Pub. Date: Jun. 14, 2001

(30) Foreign Application Priority Data

| Dec. 9, 1999 | (RU) | ............................................ 99127326 |
| May 5, 2000 | (RU) | ........................................ 2000111919 |
| Jun. 9, 2000 | (RU) | ........................................ 2000115814 |

(51) Int. Cl.[7] ............................................. H01L 23/467
(52) U.S. Cl. ........................ 165/121; 165/80.3; 361/697
(58) Field of Search ................................ 165/80.3, 185, 165/121; 361/697, 704, 710; 257/719, 722; 174/16.3

(56) References Cited

U.S. PATENT DOCUMENTS

| 2,632,598 | A |   | 3/1953 | Wales, Jr. |
| 4,715,438 | A | * | 12/1987 | Gabuzda et al. ............. 165/185 |
| 5,019,880 | A | * | 5/1991 | Higgins, III ................ 257/714 |
| 5,297,926 | A |   | 3/1994 | Negishi |
| 5,377,745 | A | * | 1/1995 | Hsieh ......................... 165/80.3 |
| 5,559,674 | A |   | 9/1996 | Katsui |
| 5,597,034 | A | * | 1/1997 | Barker et al. ............... 165/80.3 |
| 5,629,834 | A |   | 5/1997 | Kodama et al. |
| 5,661,638 | A |   | 8/1997 | Mira |
| 5,794,687 | A |   | 8/1998 | Webster, Jr. et al. |
| 5,838,066 | A | * | 11/1998 | Kitajo ......................... 257/722 |
| 5,957,659 | A |   | 9/1999 | Amou et al. |
| 6,125,920 | A | * | 10/2000 | Herbert ...................... 165/80.3 |
| 6,194,798 | B1 |  | 2/2001 | Lopatinsky |
| 6,244,331 | B1 |  | 6/2001 | Budelman |
| 6,249,071 | B1 |  | 6/2001 | Lopatinsky |
| 2001/0027855 | A1 | | 10/2001 | Budelman |

FOREIGN PATENT DOCUMENTS

| DE | 42 30 420 A1 | 4/1993 |
| DE | 42 26 843 A1 | 2/1994 |
| JP | 8-195456 A | * 7/1996 | ......... H01L/23/467 |
| TW | 277766 A | 6/1996 |

* cited by examiner

*Primary Examiner*—Allen Flanigan
(74) *Attorney, Agent, or Firm*—Frishauf, Holtz, Goodman & Chick, P.C.

(57) ABSTRACT

An apparatus and method for a centrifugal pump (1) for pumping sensitive biological fluids which includes (i) an integral impeller and rotor (21) which is entirely supported and rotated magnetically by electromagnets (52, 54), (ii) a pump housing (12, 14) and arcuate passages for fluid flow and containment, (iii) a brushless driving motor (40) embedded and integral with the pump housing (12, 14), (iv) a power supply and (v) specific electronic sensing and control algorithms-all fitly jointed together to provide efficient, durable and low maintenance pump operation. A specially designed impeller (21) and pump housing (12, 14) provide the mechanism for transport and delivery of fluid through the pump to a pump output port with reduced fluid turbulence.

33 Claims, 8 Drawing Sheets

COOLER FOR ELECTRONIC DEVICES

FIELD OF THE INVENTION

The invention covered by this application is related to devices intended for cooling electronic devices by removing heat by a flow of gas, in particular, air flow, said flow being produced by a blower.

BACKGROUND OF THE INVENTION

The most widespread devices are the ones that comprise a heat exchanger represented by a heat sink, on one surface of which an electronic device (for instance, semiconductor device or computer processor) is installed, while another surface is made in the form of heat dissipating surface. The airflow is produced by a blower (axial fans may serve as a blower).

There are known devices of this type—see, for example, U.S. Pat. No. 5,867,365 "CPU heat sink assembly" published on Feb. 2, 1999 (priority date—Jun. 10, 1997), Int.Cl. H05K 7/20, and U.S. Pat. No. 5,661,638 "High performance spiral heat sink" published on Aug. 26, 1997 (priority date—Nov. 3, 1995), Int.Cl. H05K 7/20.

The design of the device described in U.S. Pat. No. 5,867,365 comprises an axial fan that produces a flow passing by heat exchanging channels of the heat sink. The majority of inlets to heat exchanging channels are located just opposite the axial fan's impeller with a certain number of said channels being placed radially in relation to fan axle.

U.S. Pat. No. 5,661,638 also involves the application of an axial fan. Specific embodiment of device claimed in said patent involves such placement of heat exchanging channels of the heat sink that they are located centrally-symmetrically about the fan axle. To increase the heat exchange area, the heat exchanging channels are made of spiral-like shape and bent backwards in the direction of blower rotation. In this case the fan is installed in a recess made in the heat sink body.

In the above-mentioned designs, the axial fan produces sufficiently high air pressure. However, due to the weak airflow in the area adjacent to fan axle, the conditions for cooling the central part of the heat sink located underneath the fan are unfavorable. In this case non-uniform cooling of the heat sink and electronic device (in our case, processor) will take place. Besides, the energy of airflow outgoing from fan impeller in the axial direction is expended on deceleration and turn in motion before this airflow enters the heat exchanging channels. This fact decreases the speed of airflow passing by the heat exchanging channels, which, in its turn, doesn't allow to obtain good conditions for heat exchange process.

Centrifugal blowers are used much more rarely in the cooling device designs for the purpose of producing airflow.

Specifically, U.S. Pat. No. 5,838,066 "Miniaturized cooling fan type heat sink for semiconductor device" published on Nov. 17, 1998 (priority date—Dec. 16, 1996), Int.Cl. H05K 7/20 offers a design employing a centrifugal blower that is installed to the side of the heat sink. In one particular embodiment of this invention the cooling airflow passes by rectilinear heat exchanging channels of the heat sink.

However, placement of centrifugal blower to the side of the heat sink increases device size. This is so because such location of centrifugal blower leads to insufficient coordination between the direction of channel inlets and direction of airflow supplied from the blower. The loss in airflow energy results in the reduction of airflow motion speed in heat exchanging channels and in the decline of heat exchange efficiency. A portion of energy is also expended on friction against the casing, in which the blower is enclosed.

The closest analogue to the invention being claimed is an invention described in the patent of Japan No 8-195456 entitled "Cooler for electronic apparatus" (priority date—Jan. 17, 1995; application for patent published on Jul. 30, 1996; Int.Cl. H01L 023/467).

Device design comprises a centrifugal fan enclosed in the casing and installed above the heat exchanging channels that are made divergent. Another heat sink surface is made so that the possibility of thermal contact with an electronic device is provided for. The inlet of the centrifugal fan faces the heat sink. The fan produces an airflow that passes by heat exchanging channels and then gets sucked into the inlet of the centrifugal fan.

Since the centrifugal fan operates by suction, there is an area in the central part of the heat sink that is poorly blown around by the airflow (which could be seen from the Fig. presented in the published patent). Therefore, cooling of the heat sink's central part, which is the hottest, is performed ineffectively. This disadvantage results in the uneven cooling of the heat sink. To avoid uneven cooling of the heat sink, one has to raise the fan power. In addition, the device is of quite considerable height because the centrifugal fan is placed above the heat sink.

SUMMARY OF THE INVENTION

The engineering problem to be solved with the help of the invention being claimed herein is the development of a cooler for electronic devices that ensures more uniform cooling of electronic devices due to more effective cooling of the central part of the heat exchange element and the reduction of cooling device size.

Two options of addressing this problem are being claimed.

The essence of the invention in conformity with the first option consists in the following.

A cooler for electronic devices comprises a heat exchange element (i.e. heat sink) with divergent heat exchanging channels made on its one side, while its other side is made so that a possibility of thermal contact with an electronic device is provided for, and a centrifugal blower installed on the heat exchange element in such a way that it provides for the passing of cooling flow by heat exchanging channels.

The centrifugal blower is installed in the center of symmetry of heat exchanging channels. It supplies cooling flow (for instance, airflow) to the central part of heat exchange element. Since the blower impeller is located right opposite the inlets of said heat exchanging channels, the cooling flow is then supplied to channel inlets and as it moves by said channels it cools the heat exchange element down.

Since the centrifugal blower is installed at the same level as the heat exchanging channels are, the size of the device in height is reduced and the cooling flow is directed into the heat exchanging channels without energy expenditures on turning the flow (from axial direction to the radial direction). The latter is explained by the fact that flow turn is effected owing to the properties of centrifugal blower design.

The above-mentioned specific features of the device claimed herein provide for a special cooling pattern, which is characterized by the fact that the hottest part of the heat exchange element (namely, its central part) gets cooled first, and, as compared to the above-described prototype, the entire cooling process proceeds more evenly and without losses that are caused in said prototype by flow turn and friction when the cooling flow (going from the impeller) enters the heat exchanging channels. As a consequence, when using the invention being claimed one would need a blower of lesser power and size.

It is advisable that centrifugal blower be equipped with an impeller of drum type. In this case the impeller has wide enough suction hole that makes it possible to produce a powerful enough flow to cool the central part of the heat exchange element well. Besides, for a given blower capacity, a centrifugal blower with a drum-type impeller has minimal size and rotational speed as compared to centrifugal blowers with an impeller of other type.

For the purpose of increasing heat exchange area, the heat exchanging channels can be made in the form of rows of profiled elements. In particular, these elements can me made in the form of needles.

As a particular embodiment of the invention, the heat exchanging channels may be made spiral-like and bent in the direction of centrifugal blower rotation. This will provide for the prolonged contact between the airflow and heat exchange element surface.

In addition, the heat exchanging channels may be made of constant width. This will make it possible to ensure the constancy of speed at which the airflow blows the surfaces of heat exchanging channels over. Besides, making heat exchanging channels of constant width would enable one to attain the maximum "density" of heat exchanging channels on the heat exchange element surface, which would result in obtaining greater heat exchange area.

When making heat exchanging channels spiral-like or of constant width it is advisable to orient their inlets in the direction of propagation of the output flow produced by centrifugal blower impeller. In this case the best matching between the channels and incoming airflow is attained, which, in its turn, would sustain the airflow speed at the maximum possible level.

To attain improved heat exchange in the central part of the heat exchange element, the surface underneath the suction hole of the centrifugal blower may be made needle-shaped. This part of the heat exchange element is in essence located inside the centrifugal blower—in the area of the main airflow. With such an arrangement of the heat exchange element there will be practically no extra losses for the flowing over the needles, while heat exchange will be improved.

Making heat exchange element underneath the blower bent out will raise the efficiency of heat exchange. Since the centrifugal blower is installed at the same level as the heat exchanging channels are, the cooling flow is directed to the heat exchanging channels without energy expenditures spent on the turn of the flow (from axial direction to the radial direction). This flow turn is made owing to the features of centrifugal blower design and shape of the heat exchange element underneath the blower. Bent part of the heat exchange element located in the central part of blower impeller has greater heat exchange surface as compared to the case when heat exchange element is made flat. Besides radial velocity component, the airflow passing along the side conical surface of the bent part of the heat exchange element has additional tangential velocity component. Thus, due to the fact that the speed at which the heat exchange surface is blown around is increased the extra rise in heat exchange efficiency is attained. In addition, the distance between the bent surface and blower inlet is decreased in this case, which fact facilitates the increase in the airflow speed in the gap between the heat exchange element and blower impeller, thus giving extra gain in cooling efficiency.

Small height of the device claimed herein represents another important engineering accomplishment. Semiconductor device or processor is installed in the recess formed by the concave part of the heat exchange element. This concave part of the heat exchange element goes into the central part of blower impeller, which fact also decreases the size.

The above-indicated specific features of device design results in the fact that cooling flow is supplied first to the central part of the heat exchange element, which is the hottest part. Cooling of this part proceeds more evenly and without losses expended on flow turn and friction when the cooling flow (going from the impeller) enters the heat exchanging channels. As a consequence, when using the present invention design with a bent central part of the heat exchange element one would need a blower of lesser power and size.

For the purpose of improving heat exchange, the surface of the bent part of the heat exchange element (i.e. the surface facing the inlet opening of the centrifugal blower) may be made profiled in such a way that a developed heat exchange surface is produced (for instance, needle-shaped surface), e form of rows of profiled elements. This part of the heat exchange element is in essence located inside the centrifugal blower—in the area of the main airflow. With such an arrangement of the heat exchange element there will be practically no extra losses for the flowing over the needles, while heat exchange will be considerably improved.

To prevent additional noise caused by the pulsation of pressure of the cooling flow at the inlets of the heat exchanging channels, it is advisable to install the centrifugal blower impeller with a radial gap of no less than 0.03 d (where d is the diameter of centrifugal blower impeller) in relation to the inlets of the heat exchanging channels.

The heat exchanging channels may be covered with a plate from above. In this case the cooling airflow will propagate only along the channels.

The cooler for electronic devices in conformity with the second option is made as follows.

The device comprises a heat exchange element (i.e. heat sink) with divergent heat exchanging channels made on its one side, while its other side is made so that a possibility of thermal contact with an electronic device is provided for, and a centrifugal blower installed on the heat exchange element in such a way that it provides for the passing of cooling flow by heat exchanging channels.

A disk-type centrifugal blower with at least one disk is used in the design. The disks are installed in such a manner that the edge of disk surface facing the heat exchange element is located opposite the inlets to the heat exchanging channels.

The centrifugal blower supplies cooling flow (for instance, airflow) to the central part of the heat exchange element, which fact facilitates the effective cooling of the hottest part of the heat exchange element. Transfer of energy from blower disk to the airflow proceeds due to the friction forces.

The airflow blows the central part of the heat exchange element over not only in the radial direction, but also in the tangential one, due to which fact an additional increase in airflow speed in the central part of the device takes place and extra gain in cooling efficiency is attained.

Since the edges of blower disk surfaces facing the heat exchange element are located opposite the inlets to the heat exchanging channels, the cooling flow is supplied to said inlets and as the airflow passes by the channels it cools the heat exchange element down. The disk-type centrifugal blower generates radial component of the cooling flow, and said radial component matches the inlets to the heat exchanging channels well.

The disk-type centrifugal blower is characterized by small size (in terms of height) while being effective enough. In addition, it is also characterized by minimal noise level as compared to other types of centrifugal blowers, all other factors being equal.

The above-mentioned specific features of the device claimed herein provide for a special cooling pattern, which is characterized by the fact that the hottest part of the heat exchange element (namely, its central part) gets cooled first, and, as compared to the above-described prototype, the entire cooling process proceeds more evenly and without losses that are caused in said prototype by flow turn and friction when the cooling flow (going from the blower disk) enters the heat exchanging channels. As a consequence, when using the invention being claimed one would need a blower of lesser power and size.

In addition, the surface of at least one of the disks of the disk-type centrifugal blower (facing the heat exchange element) may be equipped with radial fins that increase the radial component of the airflow.

Besides, axial blower blades may be installed on at least one of the disks of the centrifugal blower near its central opening, said blades being attached to the disk. The blades may be installed on one disk or on several disks. Installation of axial blower blades near the central opening of the disk increases the pressure of cooling airflow in the central part of the heat exchange element with the blower capacity being the same. Such a design of the disk-type centrifugal blower coupled with installation of axial blower blades makes it possible to attain the same blower capacity with a lower number of revolutions, which fact results in additional decrease in noise level generated by the blower.

According to one of the design options, the axial blower blades may be formed by straps that secure disk on the axle of the centrifugal blower.

The heat exchange element underneath the blower may be made bent in the direction to the blower so that the bent part of the heat exchange element is located underneath the inlet of disk blower. In this case the overall size of the device is reduced (because an electronic device fits into the recess) and cooling process is improved (because the hottest central part is blown over with a portion of flow passing at a higher speed).

For the purpose of increasing the heat exchange area, the heat exchanging channels can be made in the form of rows of profiled elements. In particular, these elements can me made in the form of needles.

As a particular embodiment of the invention, the heat exchanging channels may be made spiral-like and bent in the direction of centrifugal blower rotation. This will provide for the prolonged contact between the airflow and heat exchange element surface.

In the latter case the heat exchanging channels may be made of constant width. This will make it possible to ensure the constancy of speed at which the airflow blows the surfaces of heat exchanging channels over. Besides, making heat exchanging channels of constant width would enable one to attain the maximum "density" of heat exchanging channels on the heat exchange element surface, which would result in obtaining greater heat exchange area When making heat exchanging channels spiral-like (including the case when they are made of constant width) it is advisable to orient their inlets in the direction of the propagation of the output flow produced by centrifugal blower. In this case the best matching between the channels and incoming airflow is attained, which, in its turn, would sustain the airflow speed at the maximum possible level.

To attain improved heat exchange, the surface of the heat exchange element part facing the inlet of the centrifugal blower may be made profiled in such a way that a developed heat exchange surface is produced (for instance, it may be made needle-shaped). This part of the heat exchange element is located in the area of the main airflow. Therefore, it gets cooled effectively. With such an arrangement of the heat exchange element there will be practically no extra losses for the flowing over the needles, while heat exchange will be considerably improved.

In addition, from the inside, the heat exchanging channels may be covered with a plate from above secured to the surface of the heat exchange element. In this case the entire cooling airflow will propagate only along the channels, which fact also facilitates the improved heat exchange.

DETAILED DESCRIPTION OF PREFERRED EMBODIMENTS

Figure 1:
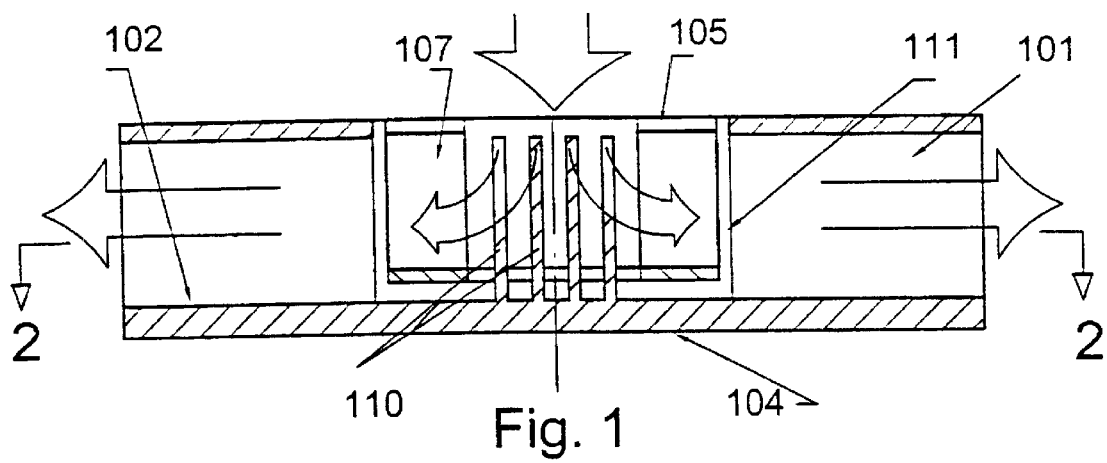
FIG. 1—general view of the first design option of the device claimed herein (with heat exchanging channels being arranged radially)

Below is described the first design option of the device claimed herein.

The cooler for electronic devices (FIG. 1 and FIG. 2) comprises a heat exchange element 101 with divergent heat exchanging channels 103 made on its one surface 102, while its other surface 104 is made so that a possibility of thermal contact with an electronic device (not shown in FIG. 1) is provided for. The device also comprises a centrifugal blower 105 installed on the heat exchange element 101 in the center of symmetry 106 in relation to heat exchanging channels 103.

Figure 2:
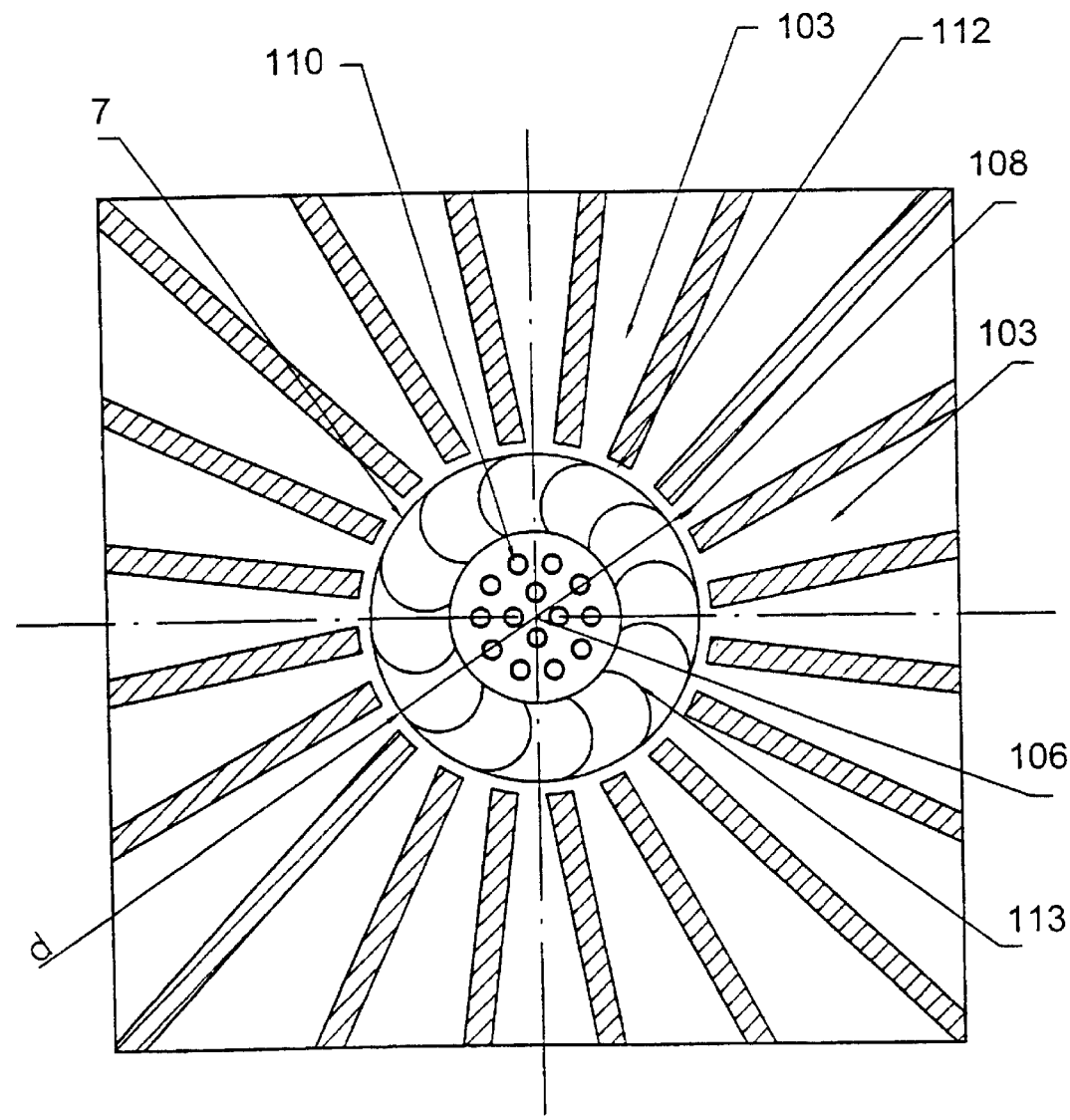
FIG. 2—a sample design of radially diverging heat exchanging channels.
Figure 6:
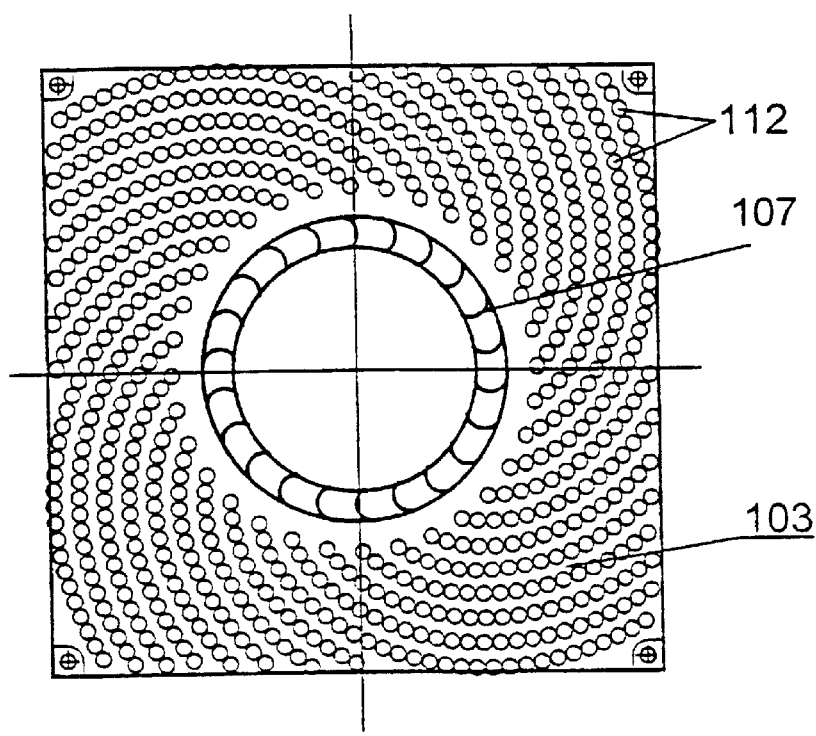
FIG. 6—a sample design of heat exchanging channels formed by rows needle-shaped profiled elements.
Figure 9:
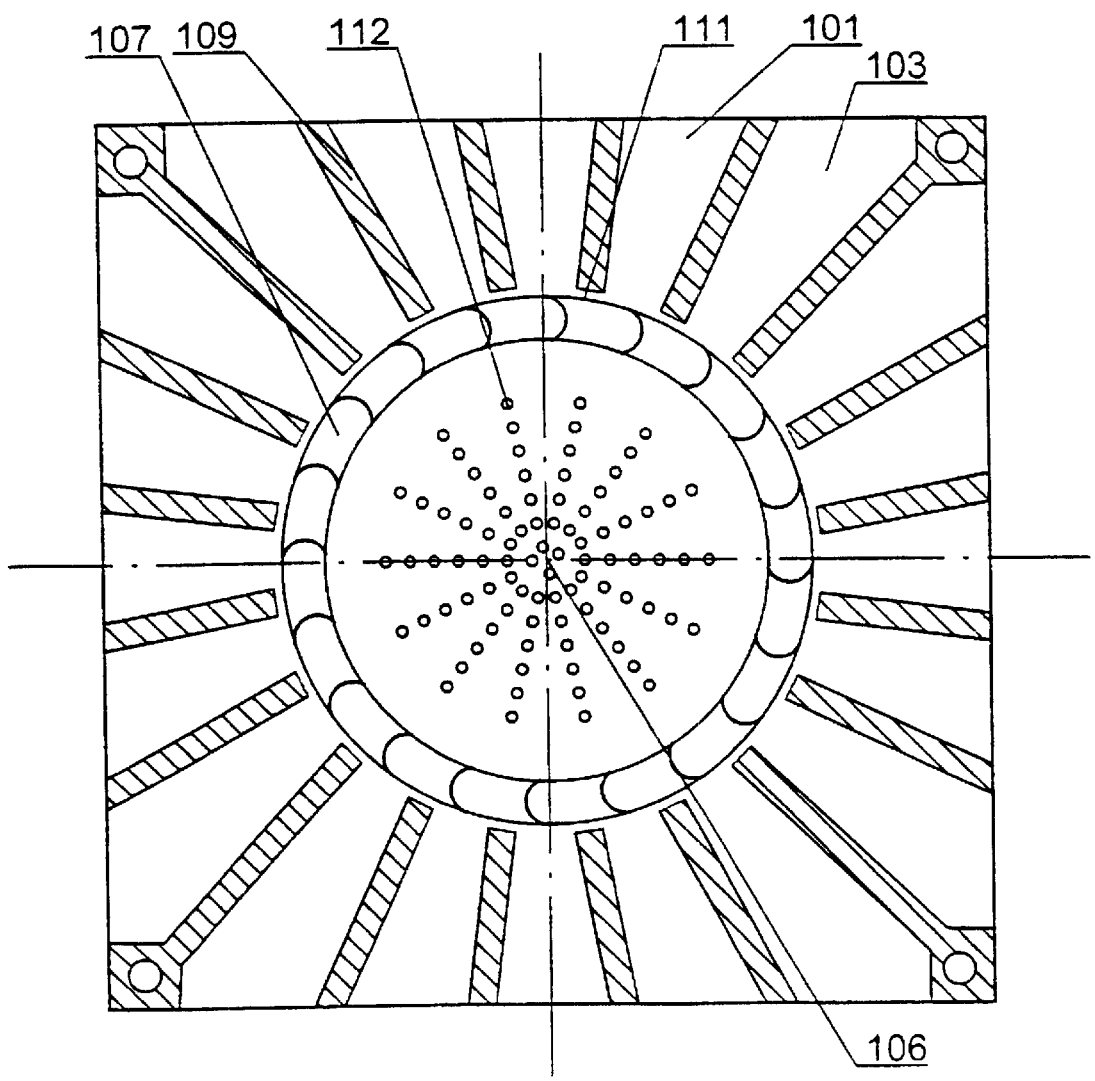
FIG. 9—a sample design of radial heat exchanging channels with a heat exchange element bent underneath the blower (in accordance with the first device design option)

FIG. 1 and FIG. 2 present radially diverging heat exchanging channels 103. Impeller 107 of centrifugal blower 105 is placed opposite inlets 108 of heat exchanging channels 103. Sample designs of centrifugal blower 105 having drum-type impeller 107 are shown in FIG. 6 and FIG. 9. Such drum-type centrifugal blowers are characterized by the fact that the value of the relation of impeller inner diameter to its outer diameter is no less than 0.75.

In the device claimed herein (see FIG. 3) heat exchanging channels 103 may be made spiral and bent over in the direction of rotation of centrifugal blower 105.

One more embodiment of device design (see FIG. 4) is characterized by the fact that heat exchanging channels 103 are of constant width.

Figures 3, 4:
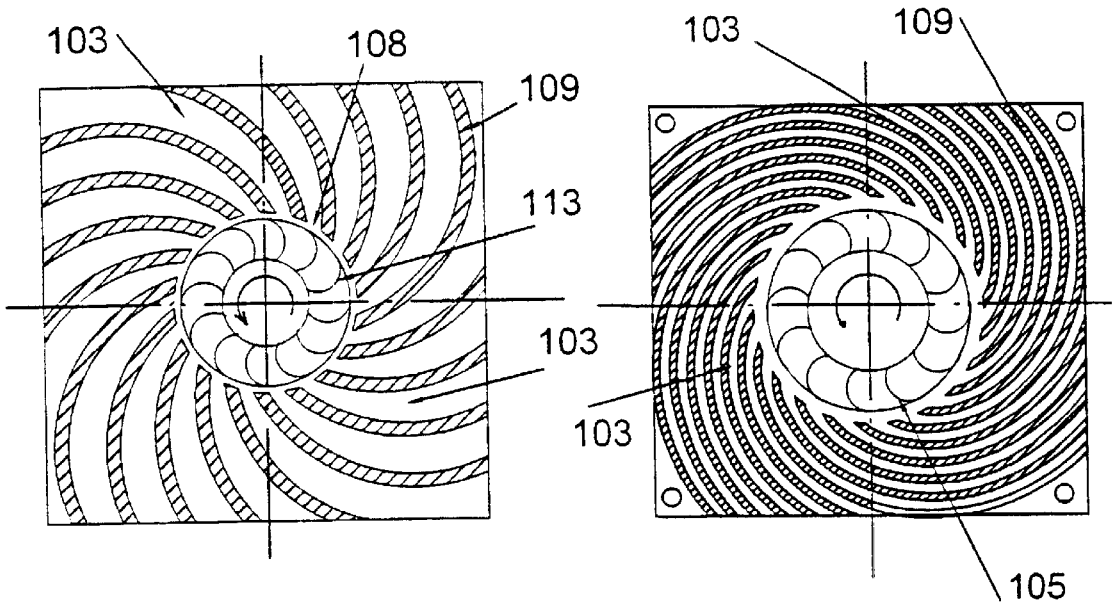
FIG. 3—a sample design of radially diverging spiral-like heat exchanging channels.
FIG. 4—a sample design of spiral-like heat exchanging channels of constant width.

In the embodiments of device design presented in FIG. 3 and FIG. 4, inlets 108 of heat exchanging channels 103 are oriented in the direction of propagation of the output flow produced by impeller 107 of centrifugal blower 105. It is best to orient the inlets of heat exchanging channels in such a way that the angle between the axis of heat exchanging channel inlets and the direction of incoming airflow produced by impeller 107 will lie within the range ±5° (see FIG. 5).

Figure 5:
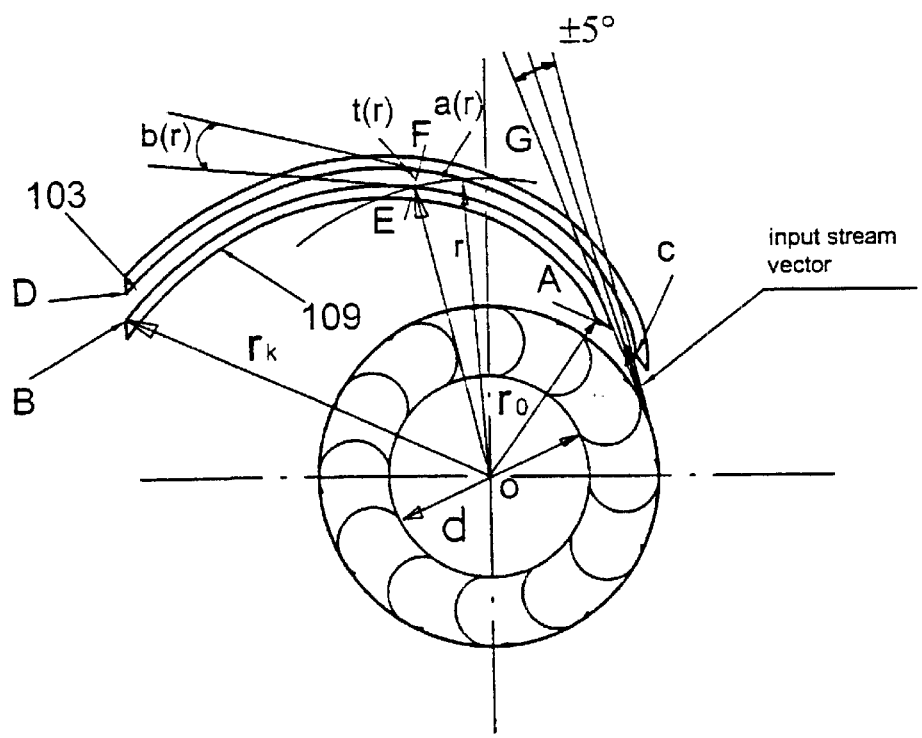
FIG. 5—an illustration to geometric relationships needed for the calculation of the profile of spiral-like heat exchanging channels of constant width.

FIG. 5 shows heat exchanging channel 103 formed by two fins 109 (arc AB and arc CD) and corresponding geometric constructions needed for the calculation of the profile of heat exchanging channels of constant width. For an arbitrary point E of arc AB located at distance r from center of symmetry O and point F (corresponding to said point E) of arc CD [the distance between two said points t(r) represents the width of heat exchanging channel], point G of arc CD located also at distance r from the center of symmetry O is determined. Distance a(r) between point E and point G for a great number of heat exchanging channels Z is approximately equal to the length of arc EG—i.e. $a(r) \approx 2\pi r/Z$. Under the same conditions the value of t(r) may be defined as $t(r) \approx a(r) \cdot \sin[b(r)]$. Using numeric methods it is possible to calculate for t(r)=T (where T=const) the values of angle b(r), thus determining the profile of a heat exchanging channel. In particular, FIG. 4 present an example of sample design with a number of heat exchanging channels Z=22 and relationship between minimal distance $r=r_0$ (point A) and maximum distance $r=r_k$ (point B): $r_0=0{,}4r_k$. For the given case, the values of angle b(r) were determined, said values being within the range from $b(r_0)=34{,}22°$ to $b(r_k)=13{,}0°$.

To improve heat exchange process, the surface of heat exchange element 101 located underneath the suction inlet of centrifugal blower 105 (as shown in FIG. 1) is made needle-shaped, where 110—are needles.

In relation to inlets 108 of heat exchanging channels 103 impeller 107 of centrifugal blower 105 is installed with radial gap 111, the value of which is no less than 0.33 d, where d is the diameter of impeller 107 of centrifugal blower 105.

Heat exchanging channels 103 may be formed by the rows of profiled elements of circular, rectangular and other cross section. The said profiled elements may be made so that they are located immediately adjacent to one another (as shown in FIG. 6) where they are made in the form of needles 112. Besides, these profiled elements may be produced by making saw cuts in solid fins that make up channels 103 (for instance, in fins 109—see FIG. 4).

For all above-presented embodiments, heat exchange element 101 may be made by different methods (for instance, by casting or milling).

Figure 7:
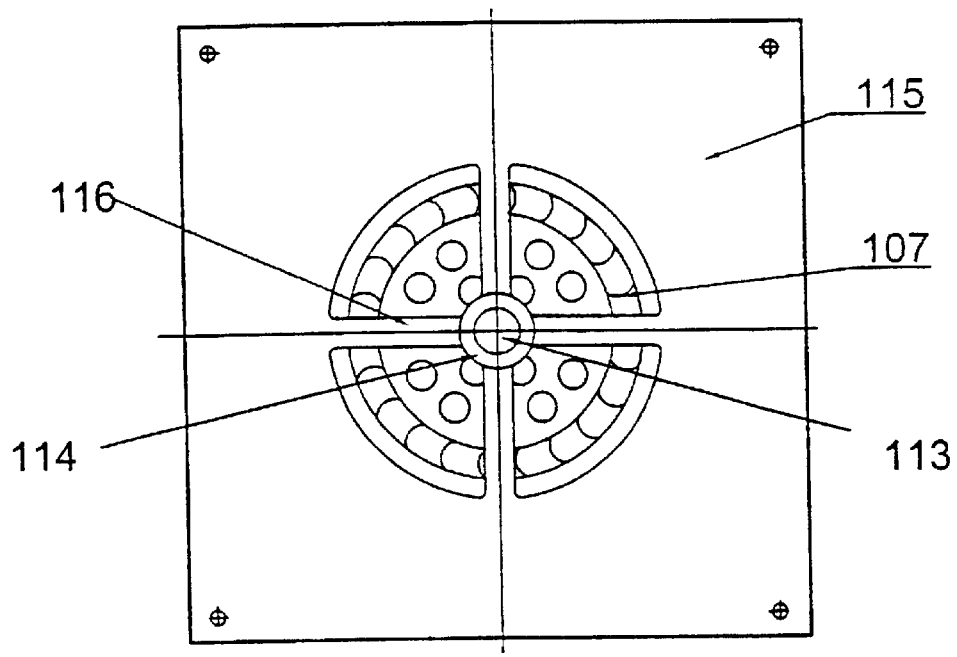
FIG. 7—a sample design of the device with a centrifugal blower fixed to the axle and a plate covering heat exchanging channels from the above.

Centrifugal blower 105 may be secured to axle 113 by means of bearing 114 (see FIG. 7). To ensure that the entire forced airflow passes by heat exchanging channels 103, the latter are covered by plate from the above. In this case plate 115 locks axle 113 by means of straps 116.

Figure 8:
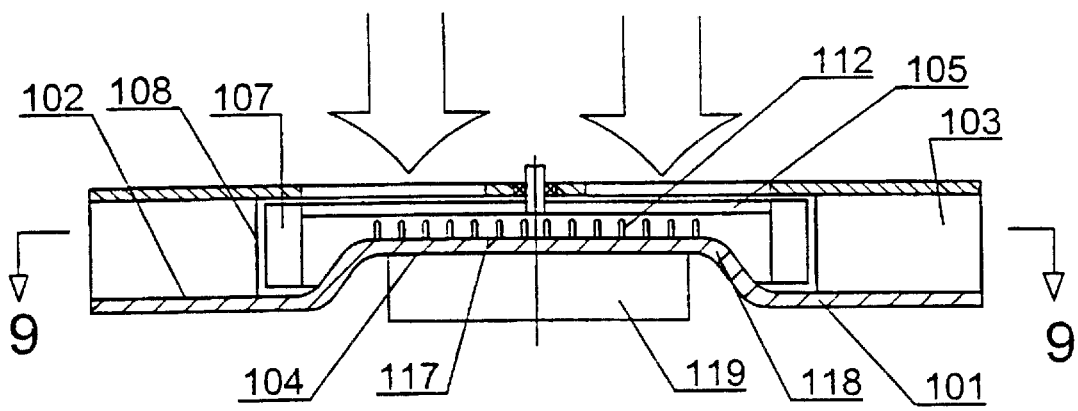
FIG. 8—a cross-section of the claimed device shown in FIG. 7 (in accordance with the first design option) with an impeller of a drum-type centrifugal blower and a heat exchange element bent underneath the blower.

In one of the embodiments of the invention (see FIG. 8 and FIG. 9), the central part 117 of heat exchange element 101 located underneath blower 105 is made bent over. Bent part 118 of heat exchange element 101 is located opposite the centrifugal blower inlet 106—in the central part 117 of impeller 108.

The claimed device in accordance with the first design option operates in the following manner.

When impeller 107 of centrifugal blower 105 rotates (see FIG. 1) the airflow at first blows over the central part of heat exchange element 101, including its needles 110. Intensive heat exchange proceeds in this area of heat exchange element 101, which is the hottest area of said heat exchange element. Impeller 107 of centrifugal blower 105 supplies the airflow to inlet 108 of heat exchanging channels 103. In the case when heat exchanging channels 103 are made spiral-like and bent in the direction of rotation of blower 105 (see FIG. 3 and FIG. 4) the airflow is directed to channels 103 without deceleration, which means that there is no loss in airflow speed when it enters channel 103. The airflow speed in heat exchanging channels 103 of constant width (see FIG. 4) is kept constant. Heat exchange between heat exchange element 101 and airflow takes place when the latter passes by heat exchanging channels 103. As a result of this heat exchange process, an electronic device being in thermal contact with heat exchange element 101 gets cooled down.

With bent central part 118 of heat exchange element 101 (FIG. 8 and FIG. 9), in addition to radial velocity component, the airflow passing along the side conical surface of the bent part of heat exchange element has additional tangential velocity component. Thus, due to the fact that the speed at which the heat exchange surface is blown over is increased the growth in airflow speed in the gap between exchange element 101 and impeller 107 of blower 105 is attained, which results in extra rise in heat exchange efficiency.

Below is described the second design option of the device claimed herein.

The cooler for electronic devices (FIG. 10 and FIG. 11) comprises a heat exchange element 201 with divergent heat exchanging channels 203 made on its one surface 202, while its other surface 204 is made so that a possibility of thermal contact with an electronic device 205 is provided for. The device also comprises a centrifugal blower 206 installed on the heat exchange element 201 in such a manner that that it provides for the passing of cooling flow by heat exchanging channels 203.

Figure 10:
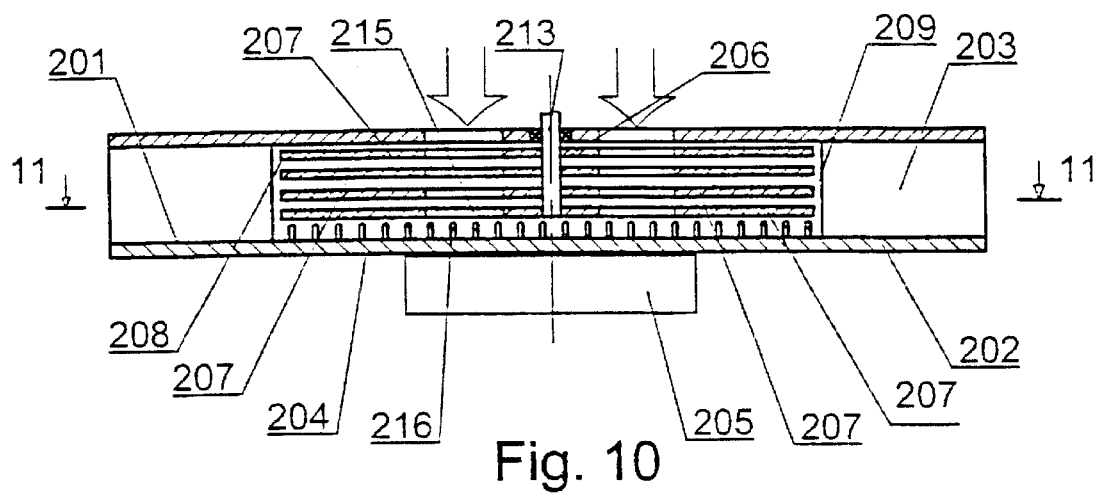
FIG. 10—a sample design of the claimed device (in accordance with the second device design option) with a centrifugal blower having several disks.
Figure 11:
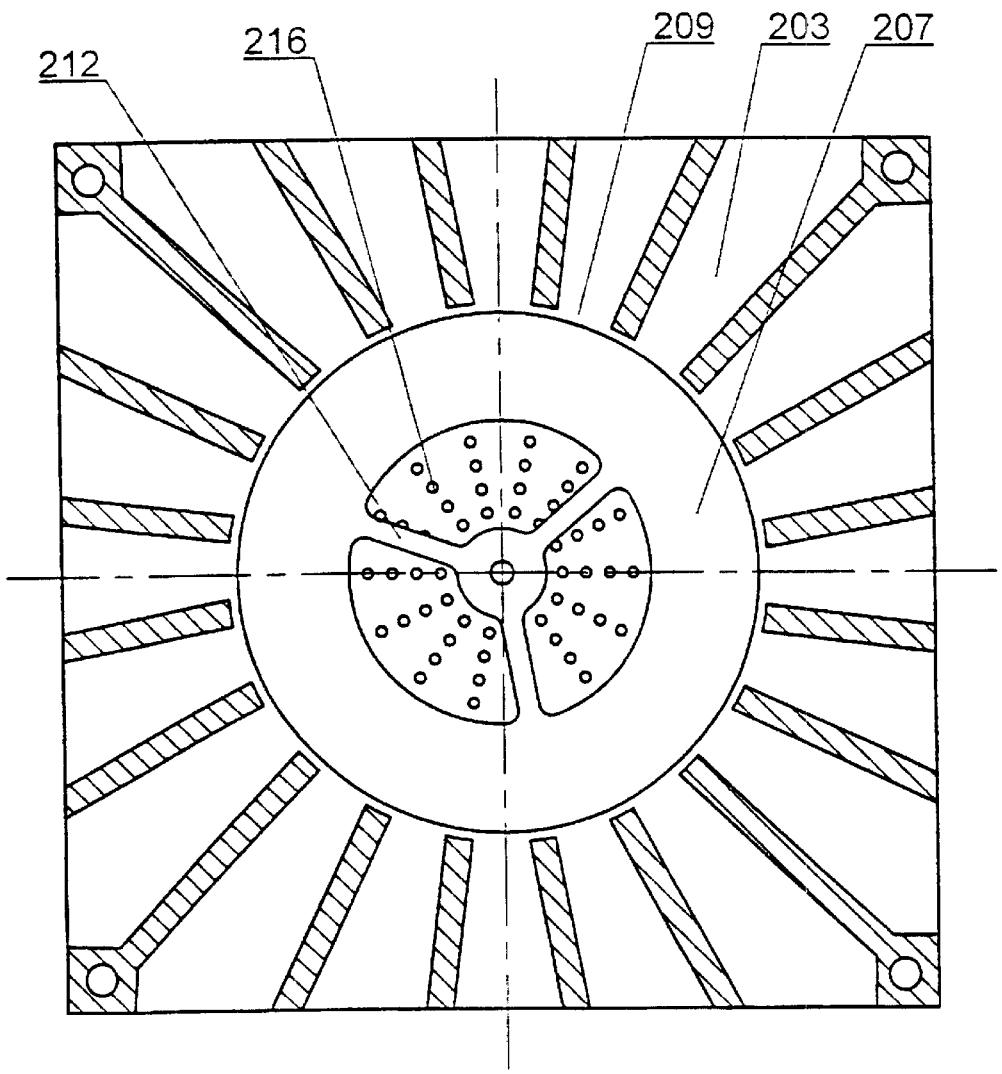
FIG. 11—a sample design of radial heat exchanging channels of the heat exchange element (in accordance with the second device design option)

A disk-type centrifugal blower 206 with at least one disk 207 is used in the design. FIG. 10 presents a sample design of centrifugal blower 206 with four disks 207. Disks 207 are installed in such a manner that the edge 208 of each disk surface facing the heat exchange element 201 is located opposite inlets 209 to the heat exchanging channels 203. A cross section of the device having radial heat exchanging channels 203 is shown in FIG. 11.

Figure 12:
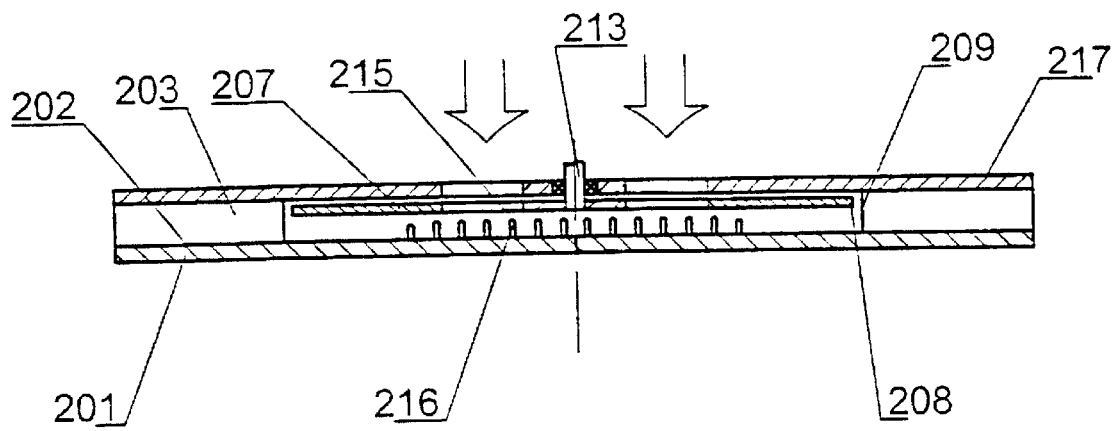
FIG. 12—a sample design of the claimed device (in accordance with the second device design option) with a centrifugal blower having one disk.

A design option of centrifugal blower 206 with one disk 207 is shown in FIG. 12. In this case heat exchange element 201 may be made of small height.

Figure 13:
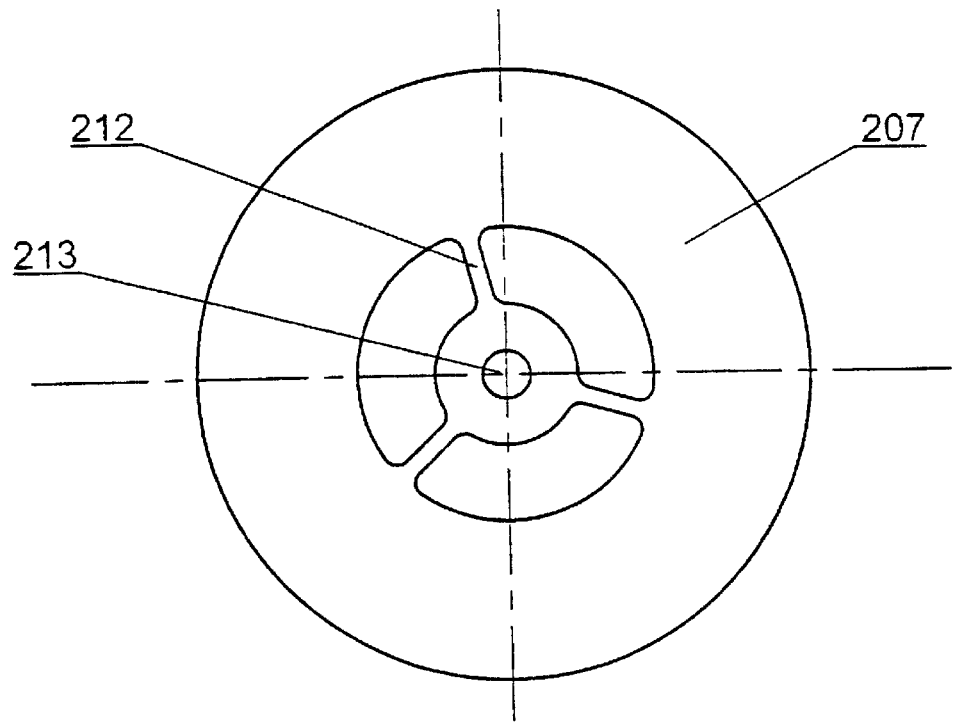
FIG. 13—a centrifugal blower disk.

A design option of disk 207 with radial straps 212, with the help of which disk 207 is secured to axle 213 of blower 206, is shown in FIG. 13.

Figure 14:
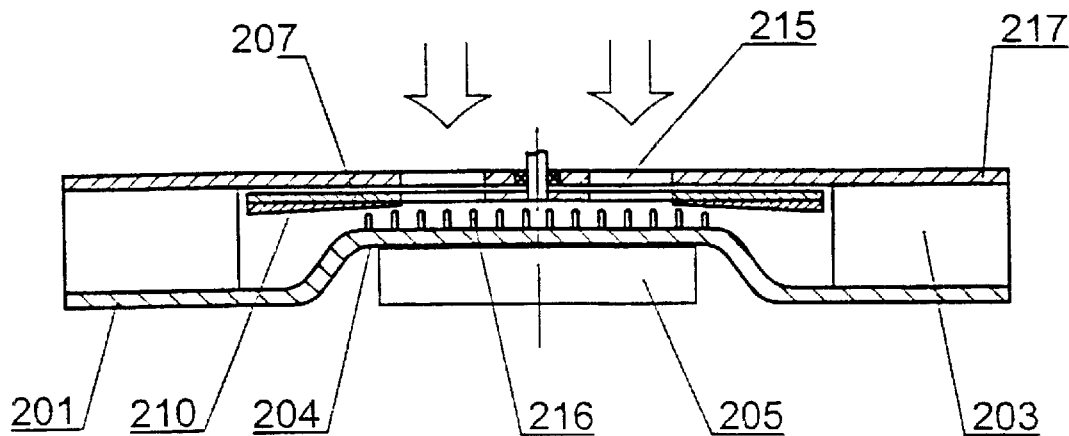
FIG. 14—a sample design of the claimed device (in accordance with the second device design option) with a centrifugal blower disk, on which radial fins are installed.
Figure 15:
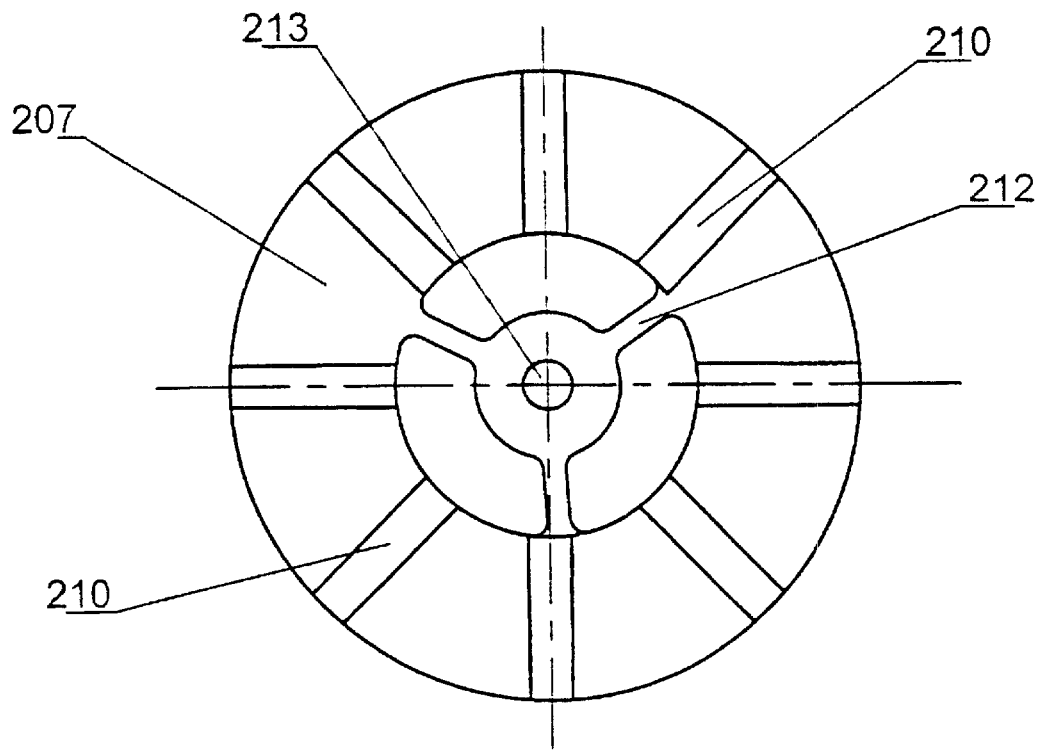
FIG. 15—a centrifugal blower disk with radial fins (bottom view)

The surface of disk 207 facing heat exchange element 201 may be equipped with radial fins 210 (see FIG. 14 and FIG. 15).

Heat exchange element 201 underneath the blower may be made bent—as is shown in FIG. 14—in such a manner that the bent part of heat exchange element is located opposite the central opening 205 of disk 207 of centrifugal blower 206.

Figure 16:
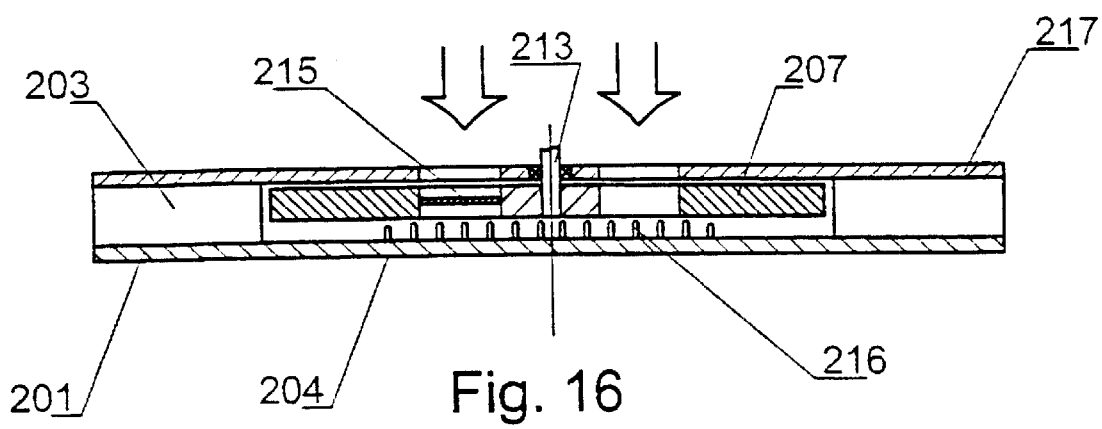
FIG. 16—a sample design of the claimed device (in accordance with the second device design option) with a centrifugal blower disk, in the area of the central opening of which axial blower blades are installed.
Figure 17:
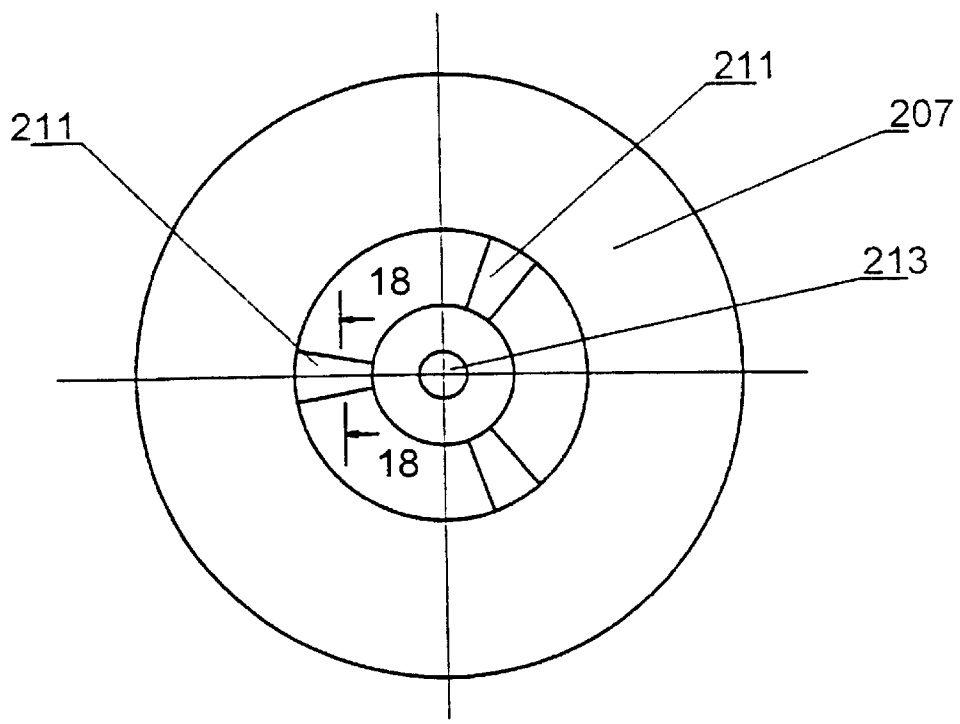
FIG. 17—a centrifugal blower disk with axial blower blades.

Axial blower blades 211 fixed to disk 207 (see FIG. 16 and FIG. 17) may be installed in the area of central opening 215 of disk 207. FIG. 16 presents an example of device embodiment with blades 211 installed on one disk 207. In this case blades 211 may also serve as straps 212 securing disk to axle 213 of blower 206.

As with the first design option of the invented device the divergent heat exchanging channels may be made spiral-like (see FIG. 3). In addition, heat exchanging channels may be made of constant width (see FIG. 4). Heat exchanging channels may be formed by rows of profiled elements—for instance, needles (see FIG. 6).

The surface of the part of heat exchange element 201 located underneath inlet 215 of disk-type blower 206 may be made profiled (for instance, needle-shaped—as shown in FIG. 10–FIG. 12, FIG. 14 and FIG. 16, where 216—needles).

For the purpose of producing an airflow directed along channels 203, it is advisable to cover heat exchanging channels 203 from the outside with plate 217 (see FIG. 10, FIG. 12, FIG. 14, and FIG. 16).

For all embodiments of the present invention, heat exchange element 101 or 201 may be made by different methods—for instance, by casting or milling Centrifugal blower 206 can be secured to axle 213 (see FIG. 10, FIG. 12, FIG. 14, and FIG. 16) by means of bearing 219. In this case plate 217 has an opening (intended to let the air pass through), Besides, plate 217 secures axle 213 to heat exchange element 201.

The claimed device in accordance with the second design option operates in the following manner.

When disks 207 of centrifugal blower 206 rotate (see FIG. 10) the airflow primarily blows over the central part of heat exchange element 201, including its needles 216. Intensive heat exchange takes place in this area of heat exchange element 201, which is the hottest area of said heat exchange element. Disks 207 of centrifugal blower 206 supply the airflow to inlet 209 of heat exchanging channels 203. In the case when heat exchanging channels 203 are made spiral-like and bent in the direction of rotation of blower 206, the cooling airflow is directed to channels 203 without deceleration, which means that there is no loss in airflow speed when it enters channel 203. The airflow speed in heat exchanging channels 203 of constant width (see FIG. 4) is kept constant.

Heat exchange between heat exchange element 201 and airflow takes place when the latter passes by heat exchanging channels 203. As a result of this heat exchange process, electronic device 205 being in thermal contact with heat exchange element 201 gets cooled down.

The airflow produced by disk 207 propagates not only in radial direction, but also in tangential direction. Fins 210 (FIG. 14 and FIG. 15) installed on disk 207 augment the radial component of the airflow.

Figure 18:
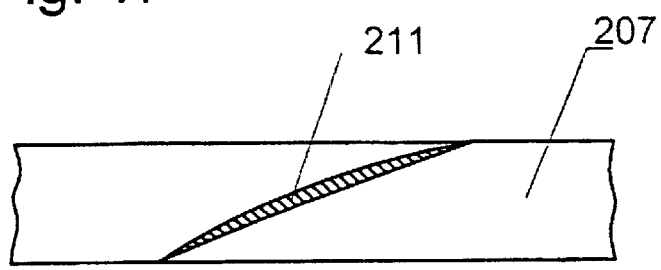
FIG. 18—a cross-section of the centrifugal blower disk shown in FIG. 17 (in the area of axial blower blade).

In the case when blades 211 of axial fan are installed in the area of the central opening 215 of disk 207 (FIG. 16–FIG. 18) said blades produce additional pressure of airflow, thus facilitating better cooling of the central part, and hence cooling of entire heat exchange element 201.

The present invention may be used for the purpose of cooling electronic devices (primarily—semiconductor devices), microcircuit chips and microprocessors.

Application of devices with a centrifugal blower, the impeller of which is located opposite the inlets to heat exchanging channels for the purpose of cooling electronic devices enables one to create effective and small-size devices for said purpose.

What is claimed is:

1. A cooler for electronic devices comprising a heat exchange element and a centrifugal blower, said heat exchange element having a first heat exchange surface and a second heat exchange surface, said first heat exchange surface having a plurality of continuous wall heat exchange channels and said second heat exchange surface being adapted to provide thermal contact with an electronic device, said centrifugal blower being positioned on said first heat exchange surface with the periphery of said blower surrounded by said plurality of continuous wall heat exchange channels whereby an outlet of said centrifugal blower is located opposite inlets of said plurality of continuous wall heat exchange channels, said centrifugal blower comprising a suction path positioned in a central part of said blower and an impeller surrounding said suction path, said impeller being operable to draw cooling gas into said suction path to cool at least a portion of said first heat exchange surface which is in the vicinity of said suction path and then to flow through said impeller which directs said cooling gas into said plurality of continuous wall heat exchange channels.

2. The cooler of claim 1, wherein said centrifugal blower has a drum type impeller.

3. The cooler of claim 1, wherein said first heat exchange surface which is in the vicinity of said suction path comprises a plurality of heat exchange elements which project into said suction path.

4. The cooler of claim 3, wherein said plurality of heat exchange elements are upwardly projecting rods.

5. The cooler of claim 3, wherein the heat exchanging channels are formed between adjacent rows of upwardly projecting rods.

6. The cooler of claim 4, wherein said rods are cylindrical.

7. The cooler of claim 1, wherein said heat exchange channels are spiral channels which are curved in a direction of rotation of said blower.

8. The cooler of claim 3, wherein said heat exchange channels are spiral channels which are curved in a direction of rotation of said blower.

9. The cooler of claim 7, wherein the inlets to the heat exchange channels are in the direction of outward gas flow from said impeller.

10. The cooler of claim 7, wherein said heat exchange channels are of constant width.

11. The cooler of claim 10, wherein the inlets to said heat exchange channels are in the direction of outward gas flow from said impeller.

12. The cooler of claim 2, wherein said first heat exchange surface which is in the vicinity of said suction path comprises a plurality of heat exchange elements which project into said suction path.

13. The cooler of claim 1, wherein said portion of said first heat exchange surface which is in the vicinity of said suction path is positioned a distance from the inlet of the said suction path which is shorter than the distance from a top of the impeller to a bottom of the impeller.

14. The cooler of claim 13, wherein said second heat exchange surface substantially follows the surface shape of said first heat exchange surface.

15. The cooler of claim 13, wherein said portion of said first heat exchange surface which is in the vicinity of said suction path comprises a plurality of heat exchange elements which project into said suction path.

16. The cooler of claim 15, wherein said plurality of heat exchange elements are upwardly projecting rods.

17. The cooler of claim 1, wherein the centrifugal blower impeller is installed with a radial gap of no less than 0.03 d (where d is the diameter of centrifugal blower impeller) in relation to the inlets of the heat exchange channels.

18. The cooler of claim 1, wherein the heat exchange channels are covered with a plate from above said channels.

19. The cooler of claim 1, wherein said centrifugal blower is a disk-type blower with at least one disk, and said at least one disk is positioned so that the edge of the disk facing the heat exchange element is located opposite the inlets to the heat exchange channels.

20. The cooler of claim 19, wherein said first heat exchange surface which is in the vicinity of said suction path comprises a plurality of heat exchange elements which project into said suction path.

21. The cooler of claim 20, wherein said plurality of heat exchange elements are upwardly projecting rods.

22. The cooler of claim 19, wherein the surface of said at least one disk that faces the heat exchange element has radial projections.

23. The cooler of claim 19, wherein said at least one disk is secured by connectors to the centrifugal blower axle in said suction path area.

24. The cooler of claim 23, wherein said connectors are axial blower blades.

25. The cooler of claim 19, wherein said portion of said first heat exchange surface which is in the vicinity of said suction path is positioned a distance from the inlet of the said suction path which is shorter than the distance from a top of the impeller to a bottom of the impeller.

26. The cooler of claim 25, wherein said second heat exchange surface substantially follows the surface shape of said first heat exchange surface.

27. The cooler of claim 25, wherein the heat exchanging channels are formed between adjacent rows of upwardly projecting rods.

28. The cooler of claim 27, wherein said rods are cylindrical.

29. The cooler of claim 19, wherein said heat exchange channels are spiral channels which are curved in a direction of rotation of said blower.

30. The cooler of claim 29, wherein the inlets to the heat exchange channels are in the direction of outward gas flow from said disk impeller.

31. The cooler of claim 29, wherein said heat exchange channels are of constant width.

32. The cooler of claim 31, wherein the inlets to said heat exchange channels are in the direction of outward gas flow from said disk impeller.

33. The cooler of claim 19, wherein the heat exchanging channels are covered with a plate from above said channels.

* * * * *

UNITED STATES PATENT AND TRADEMARK OFFICE
CERTIFICATE OF CORRECTION

PATENT NO.   : 6,659,169 B1                                              Page 1 of 1
DATED        : December 9, 2003
INVENTOR(S)  : Edward Lopatinsky It is certified that error appears in the above-identified patent and that said Letters Patent is hereby corrected as shown below:

<u>Title page,</u>
Item [57], ABSTRACT,
Delete and replace with the following:
-- [57] ABSTRACT    A cooler includes a heat exchange element (101) on the surface of which divergent channels (103) are formed and a centrifugal blower (105) is installed on the heat exchange element (101) in such a way that it provides for the flow of coolant through the channels (103). The centrifugal blower (105) can be a drum type, with impeller located opposite the inlets of said heat exchanging channels (103). In accordance with a second design option, a disk-type centrifugal impeller (206) is used, which has at least one disk (207). The disk or disks (207) of the centrifugal blower are installed in such a manner that edge of the disk surface facing the heat exchange element is located opposite the inlets to the heat exchange channels (103). --

Signed and Sealed this

Sixteenth Day of March, 2004

JON W. DUDAS
*Acting Director of the United States Patent and Trademark Office*